US008278549B2

(12) United States Patent
Lu et al.

(10) Patent No.: US 8,278,549 B2
(45) Date of Patent: Oct. 2, 2012

(54) TCO-BASED HYBRID SOLAR PHOTOVOLTAIC ENERGY CONVERSION APPARATUS

(75) Inventors: Hsin-Chun Lu, Tao-Yuan (TW);
Kuo-mei Wu, Tao-Yuan (TW);
Pen-Hsiu Chang, Tao-Yuan (TW);
Chun-Lung Chu, Tao-Yuan (TW);
Chi-Yo Lai, Tao-Yuan (TW)

(73) Assignee: Chang Gung University, Tao-Yuan (TW)

( * ) Notice: Subject to any disclaimer, the term of this patent is extended or adjusted under 35 U.S.C. 154(b) by 599 days.

(21) Appl. No.: 12/285,261

(22) Filed: Oct. 1, 2008

(65) Prior Publication Data
US 2009/0084439 A1   Apr. 2, 2009

(30) Foreign Application Priority Data

Oct. 2, 2007  (TW) .............................. 96136834 A

(51) Int. Cl.
*H01L 31/00* (2006.01)
(52) U.S. Cl. ........ 136/256; 136/257; 136/258; 136/259; 136/260; 136/261; 136/262
(58) Field of Classification Search ........... 136/256–262
See application file for complete search history.

(56) References Cited

U.S. PATENT DOCUMENTS 5,211,761 A * 5/1993 Noguchi et al. ............. 136/258
6,437,231 B2 * 8/2002 Kurata et al. ................ 136/244
6,936,865 B2 * 8/2005 Tonooka ...................... 257/103
2006/0207647 A1 * 9/2006 Tsakalakos et al. ......... 136/256
2007/0193624 A1 * 8/2007 Krasnov ...................... 136/258
2008/0092953 A1 * 4/2008 Lee .............................. 136/261

OTHER PUBLICATIONS

Beyer et al., "Transparent conducting oxide films for thin film photovoltaics", Thin Solid Films, Aug. 28, 2007.*

* cited by examiner

*Primary Examiner* — Jennifer Michener
*Assistant Examiner* — Matthew Martin
(74) *Attorney, Agent, or Firm* — Bacon & Thomas, PLLC

(57) ABSTRACT

The invention relates to a solar photovoltaic energy conversion apparatus. The apparatus consists of a substrate, a buffer layer formed on the substrate layer, a first transparent conductive oxide layer formed on the buffer layer, periodic protrusions containing first silicon layers formed on the first transparent conductive oxide layer, second silicon layers formed on the first silicon layers, a second transparent conductive oxide layer covering the first silicon layers, the second silicon layers and the first transparent conductive oxide layer, and an anti-reflective protective layer. The first silicon layer and the second silicon layer are the electrodes with the opposite type of charge carriers. The first transparent conductive layer and the second transparent conductive layer are the electrodes with the opposite type of charge carriers. This TCO-based hybrid solar photovoltaic energy conversion device not only can allow the transmission of visible sunlight but also can enhance the photovoltaic energy.

10 Claims, 3 Drawing Sheets

TCO-BASED HYBRID SOLAR PHOTOVOLTAIC ENERGY CONVERSION APPARATUS

BACKGROUND OF THE INVENTION

1. Field of the Invention

The invention relates to a solar photovoltaic energy conversion apparatus, more particularly to a transparent conductive oxide (TCO) based hybrid solar cell device, which not only allows the transmission of visible sunlight but also can enhance the photovoltaic energy conversion efficiency.

2. Description of the Prior Art

The earliest development of the solar cell system can be traced back to 1954, which was invented and proposed by Bell Laboratory in the United States. Solar cell is a kind of solar photovoltaic energy conversion semiconductor devices that uses sunlight to generate electric power directly. By adding impurity substances into highly pure semiconductor materials, semiconductors with different property can be made. For example, boron can be added into silicon to form p-type semiconductor while phosphorus can be added into silicon to form n-type semiconductor. When p-type and n-type semiconductors are combined to form p-n junctions, electrons and holes, electric current, and, thus, electric power will be generated by exposing the reverse-biased p-n junctions to sunlight.

Though there are many kinds of solar cells, most of them are produced from materials such as crystalline silicon, amorphous silicon, III-V semiconductors, and II-VI semiconductors, etc. Solar cell systems made by the above-mentioned materials are of dark color and opaque, which means the transmittance of the solar cells to the visible light is extremely low. In addition, due to the optoelectronic characteristics of materials, solar cells made by the above-mentioned materials can only absorb sunlight within the wavelength range of the visible light. Thus, the solar photovoltaic energy conversion efficiency is unable to be enhanced effectively.

Solar cells can be classified as transparent solar cells and opaque solar cells. FIG. 1 shows the structure of the conventional transparent solar cell, which consists of a substrate 101, a buffer layer 102, a first transparent conductive layer 103, a second transparent conductive layer 104, and an anti-reflective protective layer 105. FIG. 2 shows the structure of the conventional opaque solar cell, which consists of a substrate 201, a buffer layer 202, a first transparent conductive layer 203, a first silicon layer 204, a second silicon layer 205, a second transparent conductive layer 206, and an anti-reflective protective layer 207.

In the above-mentioned transparent solar cells, the advantage of high visible light transmittance is gained at the expense of the solar photovoltaic energy conversion efficiency because less solar energy can be used to generate electric power when the visible part of sunlight is not absorbed by the transparent solar cells. Though the opaque solar cell does not have the visible light transparency feature, the solar photovoltaic energy conversion efficiency is higher than that of the transparent solar cell. Therefore, how to integrate the advantages of both kinds of solar cells has become an important research and development issue for the next generation solar cells.

In the known arts, there is a U.S. Pat. No. 6,294,722 about "Integrated Thin-Film Solar Battery". Though multi-layers of transparent conductive oxide thin films are used, it is still the transparent solar cell with low solar photovoltaic energy conversion efficiency.

As of Taiwan Patent Number M279981 of "Semiconductor Sensitized Solar Cell", though the transparent conductive oxide thin film is used in the solar cell, an electrolytic layer is also added into the cell structure. In addition to higher manufacturing cost, only opaque solar cell with no visible light transparency is formed.

Therefore, how to integrate the advantages of the transparent solar cells and the opaque solar cells and to further raise the solar photovoltaic conversion efficiency have become a feasible goal and challenge for the next generation solar cells.

SUMMARY OF THE INVENTION

The foregoing, as well as additional objects, features and advantages of the invention will be more readily apparent from the following detailed description, which proceeds with reference to the accompanying drawings.

The invention relates to a solar photovoltaic energy conversion apparatus, more particularly to a transparent conductive oxide (TCO) based hybrid solar cell device, which not only allows the transmission of visible sunlight but also can enhance the photovoltaic energy conversion efficiency.

The transparent conductive oxide thin films in the invention can be used as the common electrodes of various solar cells, which can be combined with other solar cells to form hybrid solar cells.

Firstly, there is a substrate in the structure of the invention.

In the structure, there is a first p-type transparent conductive oxide (TCO) layer formed on a buffer layer.

In the structure, there is a first p-type silicon layer with periodic protrusion formed on the first p-type TCO layer.

In the structure, there is a second n-type silicon layer formed on the first p-type silicon layer having the periodic protrusion. The first p-type silicon layer and the second n-type silicon layer are semiconductors of opposite electrical property, and their positions can be interchanged.

In the structure, there is a second n-type TCO layer, which covers the side of the first p-type silicon layer, the top and the side of the second n-type silicon layer, and the top of the first p-type TCO layer. The first p-type TCO layer and the second n-type TCO layer are electrodes with opposite electrical property, and their positions can also be interchanged.

Finally, there is an anti-reflective layer in the structure, which is formed on the second TCO layer.

The invention utilizes the advantages of the transparent conductive oxide such as low cost, high visible light transparency, and large area coating capability to increase total power generation output by increasing the absorbing area.

The invention combines high solar photovoltaic energy conversion efficiency of opaque solar cells and high visible light transparency of the transparent conductive oxide to form a solar photovoltaic energy conversion apparatus with high visible light transparency and high photovoltaic energy conversion efficiency.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The following is a description of the present invention. The invention firstly will be described with reference to one exemplary structure. Some variations will then be described as well as advantages of the present invention. A preferred method of fabrication will then be discussed. An alternate, asymmetric embodiment will then be described along with the variations in the process flow to fabricate this embodiment.

Figure 1:
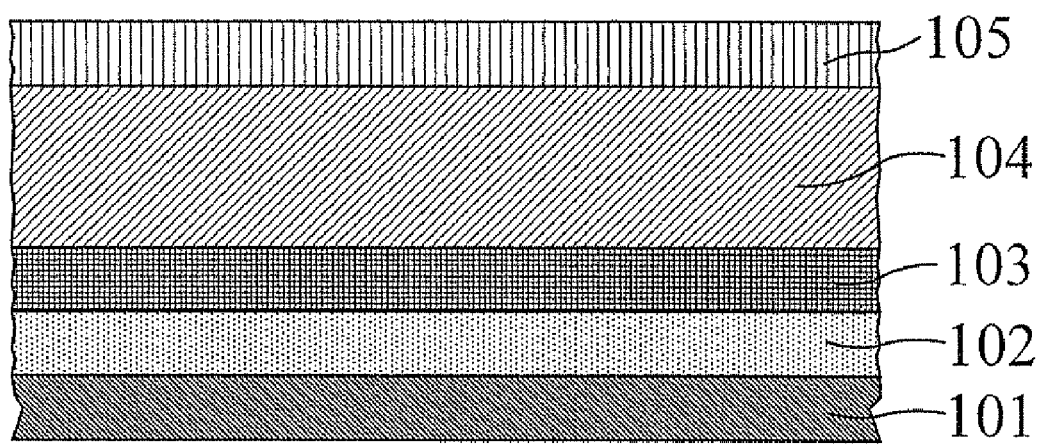
FIG. 1 shows the sectional drawing for the conventional transparent solar cell.
Figure 2:
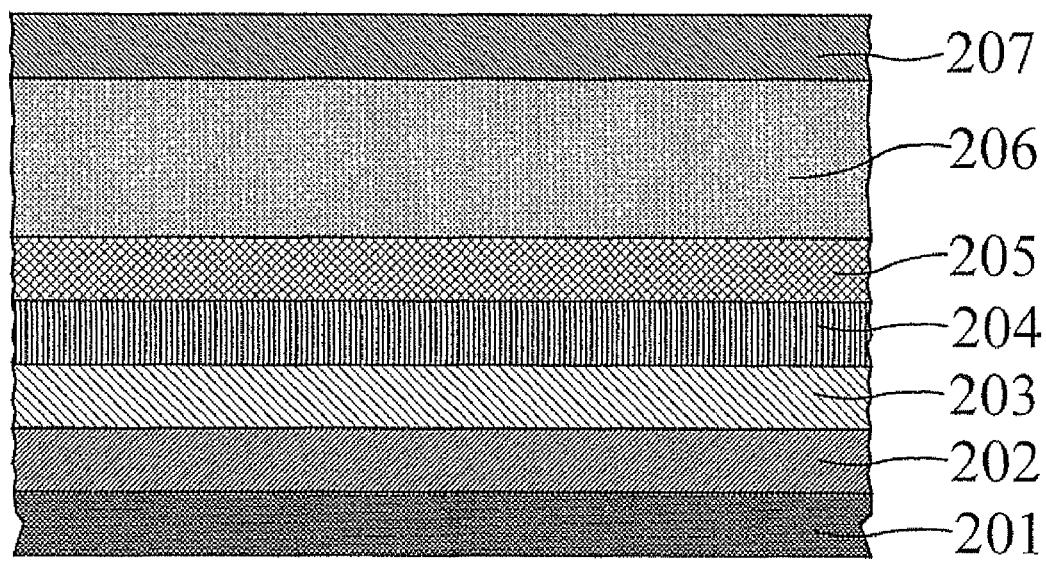
FIG. 2 shows the sectional drawing for the conventional opaque solar cell.
Figure 3:
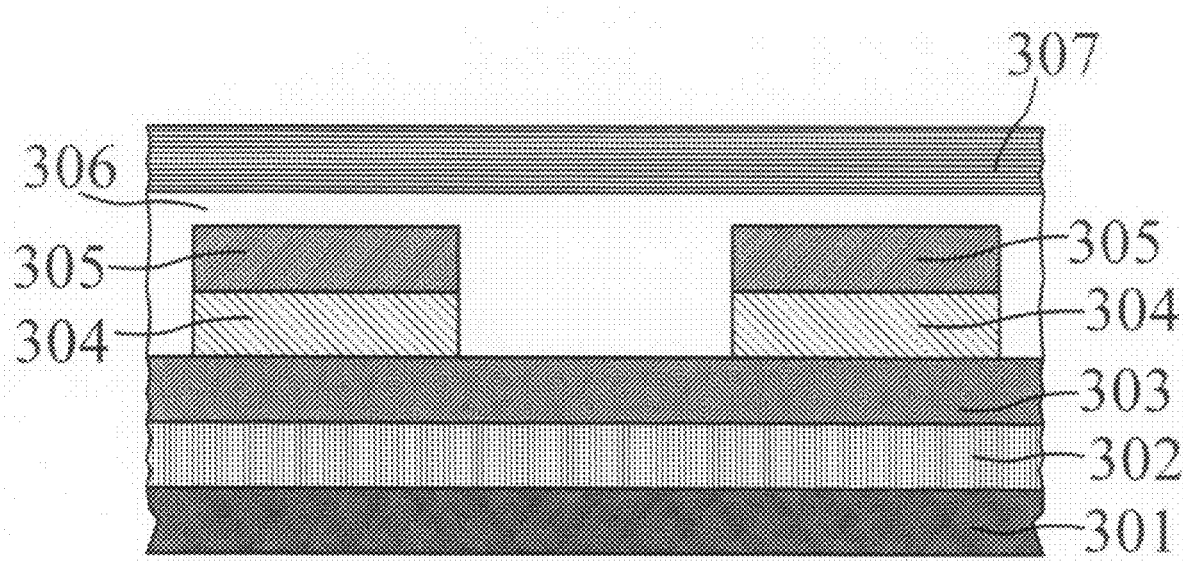
FIG. 3 shows the sectional drawing for the embodiment of the invention.

The invention relates to a solar photovoltaic energy conversion apparatus, more particularly to a transparent conductive oxide (TCO) based hybrid solar cell device, which not only allows the transmission of visible sunlight but also can enhance the photovoltaic energy conversion efficiency. The transparent conductive oxide material is adopted in the structure. The following detailed description is included in the structure of the solar cell:

As shown in FIG. 3, there is a substrate 301 in the structure, which is normally made of glass, quartz or mono-crystalline aluminum oxide.

Still as shown in FIG. 3, there is a buffer layer 302 formed on the substrate 301, and the buffer layer is often made of transparent conductive oxide (TCO) thin film.

As shown in FIG. 3, there is a first p-type TCO layer 303 formed on the buffer layer 302

Again, as shown in FIG. 3 there is a first p-type silicon layer 304 formed on the first TCO layer 303, which is often made by mono-crystalline silicon, polycrystalline silicon, and non-crystalline silicon.

As shown in FIG. 3, there is a second n-type silicon layer 305 formed on the first p-type silicon layer 304, which is often made of mono-crystalline silicon, polycrystalline silicon, and non-crystalline silicon. Thus, a plurality of protrusion with fixed spacing is formed on the p-type transparent conductive oxide layer 303, wherein every plurality of protrusion contains a separated p-type silicon layer 304 formed under a separated n-type silicon layer 305. The first p-type silicon layer 304 and the second n-type silicon layer 305 possess opposite electrical property, and the positions can be interchanged. (Thus, when the first n-type silicon layer 304 exists, the second p-type silicon layer 305 will be generated).

Still as shown in FIG. 3, in the structure, there is a second n-type TCO layer 306, which covers over the protrusions and the side of the first p-type silicon layer 304, the top and the side of the second n-type silicon layer 305, and the top of the first p-type TCO layer 303. The first p-type TCO layer 303 and the second n-type TCO layer 306 are the electrodes with opposite electrical property, and their positions can be interchanged. (Thus, when the first n-type TCO layer 303 exists, the second p-type TCO layer 306 will be generated).

Finally, as shown in FIG. 3, in the structure, there is an anti-reflective layer 307 formed on the second TCO layer 306, which is often made of the semiconductor oxide layer.

The so called transparent conductive oxide solar cell is usually made of the transparent conductive metal oxides with opposite charge carriers. Basically, a layer of p-type or n-type transparent conductive metal oxide thin film will be coated on the transparent substrate first, and then a second transparent conductive metal oxide thin film with opposite charge carrier is coated on top of the first TCO layer to form the p-n junction thin film diode solar cell.

From the solar photovoltaic energy conversion mechanism of the transparent conductive oxide used in solar cell, the ultraviolet radiation in the solar spectrum can be absorbed to generate the photovoltaic energy conversion. Theoretically, the solar photovoltaic energy conversion efficiency of transparent conductive oxide solar cell is 6%, but the solar photovoltaic energy conversion efficiency of present prototype TCO solar cell is lower, which is only about 3%. Because the present research and development of transparent conductive oxide solar cell including the detailed design of components and cell, the selection of p-type and n-type materials, and even the combination of p-type and n-type materials is still not mature, it is necessary to engage even more actively in the research and development of TCO solar cells.

Transparent conductive oxide materials can be divided into p-type transparent conductive oxides and n-type transparent conductive oxides. The p-type transparent conductive oxide materials include $CU_2O$, $ZnO$, $NiO$, $FeO$, $CuAlO_2$, $CuAlO_2$, $CuGaO_2$, $SrCuO_2$ etc. The n-type transparent conductive oxide materials include $In_2O_3$, $SnO_2$, $ZnO$, $CdO$, ITO with Sn in $In_2O_3$, IZO with Zn in $In_2O_3$, and AZO with Al in $ZnO$ etc.

Transparent conductive oxide thin films are currently being used as the common electrodes of various solar cells. TCO thin films can be combined with solar cells to form hybrid solar cells. Opaque solar cells with high solar photovoltaic energy conversion efficiency and transparent conductive oxides with high visible light transparency can be combined to form a hybrid solar photovoltaic energy conversion device with visible light transparency and high photoelectric conversion efficiency.

The existing industrial processes can be used to manufacture transparent conductive oxide thin films. The transparent conductive oxide thin film materials have the advantages such as low cost, high visible light transparency, large area coating capability, and short process time. They can be formed on the transparent substrate such as glasses at low temperature and extremely suitable to be used in this hybrid solar photovoltaic energy conversion device.

It is understood that various modifications can be readily made by those skilled in the related art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the related art to which this invention pertains.

What is claimed is:

1. A solar photovoltaic energy conversion apparatus, comprising:
   a substrate, said substrate being selected from the group consisting of glass, quartz and mono-crystalline aluminum oxide;
   a transparent conductive oxide thin film layer being formed on said substrate;
   a p-type transparent conductive oxide layer being formed on said transparent conductive oxide thin film layer;
   a plurality of protrusions with fixed spacing being formed on said p-type transparent conductive oxide layer, wherein every protrusion containing a separated p-type silicon semiconductor layer formed under a separated n-type silicon semiconductor layer;
   a n-type transparent conductive oxide layer being formed over and covering said protrusions and said p-type transparent conductive oxide layer, wherein said p-type transparent conductive oxide layer directly contacting said n-type transparent conductive oxide layer so that a plurality of transparent p-n junctions formed between said p-type transparent conductive oxide layer and said n-type transparent conductive oxide layer; and an anti-reflective layer being formed on said n-type transparent conductive oxide layer to form the solar photovoltaic energy conversion apparatus.

2. The apparatus according to claim 1, wherein said separated p-type transparent conductive oxide layer is selected from the group consisting of copper oxide nitrogen doped zinc oxide, nitrogen doped aluminum zinc oxide, nickel oxide, iron oxide, copper aluminum oxide, copper gallium oxide, and strontium copper oxide.

3. The apparatus according to claim 1, wherein said every protrusion containing a separated p-type silicon semiconductor layer formed under a separated n-type silicon semiconductor layer further comprises every protrusion containing a separated n-type silicon semiconductor layer formed under a separated p-type silicon semiconductor layer.

4. The apparatus according to claim 1, wherein said separated p-type silicon semiconductor layer or said separated n-type silicon semiconductor layer is selected from the group consisting of mono-crystalline silicon, polycrystalline silicon, and non-crystalline silicon.

5. The apparatus according to claim 1, wherein said separated n-type transparent conductive oxide layer is selected from the group consisting of indium oxide, tin oxide, zinc oxide, cadmium oxide, indium tin oxide, indium zinc oxide, aluminum zinc oxide, gallium zinc oxide, aluminum doped magnesium zinc oxide, and gallium doped magnesium zinc oxide.

6. A solar photovoltaic energy conversion apparatus, comprising:
a substrate, said substrate being selected from the group consisting of glass, quartz and mono-crystalline aluminum oxide;
a transparent conductive oxide thin film layer being formed on said substrate;
a n-type transparent conductive oxide layer being formed on said transparent conductive oxide thin film layer;
a plurality of protrusions with fixed spacing being formed on said n-type transparent conductive oxide layer, wherein every protrusion containing a separated n-type silicon semiconductor layer formed under a separated p-type silicon semiconductor layer;
a p-type transparent conductive oxide layer being formed over and covering said protrusions and said n-type transparent conductive oxide layer, wherein said n-type transparent conductive oxide layer directly contacting said p-type transparent conductive oxide layer so that a plurality of transparent p-n junctions formed between said n-type transparent conductive oxide layer and said p-type transparent conductive oxide layer; and
an anti-reflective layer being formed on said p-type transparent conductive oxide layer to form the solar photovoltaic energy conversion apparatus.

7. The apparatus according to claim 6, wherein said separated n-type transparent conductive oxide layer is selected from the group consisting of indium oxide, tin oxide, zinc oxide, cadmium oxide, indium tin oxide, indium zinc oxide, aluminum zinc oxide, gallium zinc oxide, aluminum doped magnesium zinc oxide, and gallium doped magnesium zinc oxide.

8. The apparatus according to claim 6, wherein said every protrusion containing a separated n-type silicon semiconductor layer formed under a separated p-type silicon semiconductor layer further comprises every protrusion containing a separated p-type silicon semiconductor layer formed under a separated n-type silicon semiconductor layer.

9. The apparatus according to claim 6, wherein said separated n-type silicon semiconductor layer or said separated p-type silicon semiconductor layer is selected from the group consisting of mono-crystalline silicon, polycrystalline silicon, and non-crystalline silicon.

10. The apparatus according to claim 6, wherein said separated p-type transparent conductive oxide layer is selected from the group consisting of copper oxide, nitrogen doped zinc oxide, nitrogen doped aluminum zinc oxide, nickel oxide, iron oxide, copper aluminum oxide, copper gallium oxide, and strontium copper oxide.

* * * * *